(12) United States Patent
Tong

(10) Patent No.: US 11,367,843 B2
(45) Date of Patent: Jun. 21, 2022

(54) WEARABLE DEVICE BASED ON FREE SHAPE CUTTING TECHNIQUE AND PREPARATION METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Peiqian Tong, Wuhan (CN)

(*) Notice: Subject to any disclaimer, the term of this patent is extended or adjusted under 35 U.S.C. 154(b) by 632 days.

(21) Appl. No.: 16/469,153

(22) PCT Filed: Jan. 16, 2019

(86) PCT No.: PCT/CN2019/071854
§ 371 (c)(1),
(2) Date: Jun. 13, 2019

(87) PCT Pub. No.: WO2020/124719
PCT Pub. Date: Jun. 25, 2020

(65) Prior Publication Data
US 2021/0288273 A1    Sep. 16, 2021

(30) Foreign Application Priority Data

Dec. 17, 2018 (CN) .......................... 201811541057.7

(51) Int. Cl.
*H01L 51/00* (2006.01)
*G04G 17/04* (2006.01)
*G04G 17/06* (2006.01)

(52) U.S. Cl.
CPC ....... *H01L 51/0097* (2013.01); *G04G 17/045* (2013.01); *G04G 17/06* (2013.01); *H01L 2251/5338* (2013.01)

(58) Field of Classification Search
CPC .............................................. H01L 2251/5338
See application file for complete search history.

(56) References Cited

U.S. PATENT DOCUMENTS

| | | |
|---|---|---|
| 2009/0289885 A1 | 11/2009 | Chao |
| 2015/0201503 A1 | 7/2015 | Kim |
| 2017/0364035 A1 | 12/2017 | Tang |
| 2017/0364036 A1 | 12/2017 | Tang |
| 2018/0047657 A1 | 2/2018 | Li et al. |

FOREIGN PATENT DOCUMENTS

| | | |
|---|---|---|
| CN | 102073154 A | 5/2011 |
| CN | 104780751 A | 7/2015 |
| CN | 105529338 A | 4/2016 |
| CN | 105632339 A | 6/2016 |
| CN | 105892275 A | 8/2016 |

(Continued)

*Primary Examiner* — Vip Patel

(57) ABSTRACT

A wearable device with a circular dial plate design and a method of preparing the wearable device are provided. A circular contour is achieved by a free shape cutting technique, this design can support a pointer display. A bonding region of an organic light emitting diode (OLED) unit module on which a driver integrated circuit (IC) is bonded can be effectively bent to the back of a display panel, thereby, saving space of an entire display module. In addition, the driver IC of the circular display panel adopts a ring-shaped bonding contacts design to reduce the compensation demand caused by expansion or contraction issues in a preparing process.

17 Claims, 4 Drawing Sheets

(56) References Cited

FOREIGN PATENT DOCUMENTS

| | | |
|---|---|---|
| CN | 106125542 A | 11/2016 |
| CN | 106233363 A | 12/2016 |
| CN | 106935141 A | 7/2017 |
| CN | 206422068 U | 8/2017 |
| CN | 107479360 A | 12/2017 |
| CN | 108391373 A | 8/2018 |
| JP | 2001134210 A | 5/2001 |
| JP | 2001135665 A | 5/2001 |

WEARABLE DEVICE BASED ON FREE SHAPE CUTTING TECHNIQUE AND PREPARATION METHOD THEREOF

FIELD OF INVENTION

The present invention relates to the field of display technology, and in particular, to a wearable device and a method for preparing thereof.

BACKGROUND OF INVENTION

Organic light emitting diodes (OLEDs) have many advantages such as self-illumination, low power consumption, wide viewing angles, rich colors, fast response times, and equipped with flexible screens. They are considered to be promising next-generation display technology. In the future, wearable devices on the market will be prepared with OLED display technology.

Technical Problem

Currently, due to cutting technique limitations and display driving, etc., most wearable devices are designed with a square dial plate. Time is displayed as electronic digits, and a concept of pointer display has been lost.

In addition, in a package process of the OLED device, due to an expansion or contraction of a substrate, bonding misalignment issues often occur.

As shown in FIG. 7, a conventional design of a bonding pin and a bonding contact is used. In a case where an area of a bonding region of a flexible OLED unit module expands 10%. After a driver integrated circuit (IC) bonding to the OLED unit module, it can be observed on an upper side and a lower side of the OLED unit module, more than 80% area of the bonding pins (206) of the driver IC and the bonding contacts (205) of the OLED unit module has failed to overlap (a minimum overlapping area of the bonding pin and the bonding contact is only about 18%). This is because in the conventional design when the bonding area of the flexible OLED unit module expands outward, an alignment of bonding pins and bonding contacts on an outer area will be more affected.

Technical Solution

To solve the above problem, the present invention provides a wearable device, including: a carrier having a carrying space; a wearing component connecting to the carrier; a flexible organic light emitting diode (OLED) unit module, the flexible OLED unit module being accommodated in the carrying space and including a display region, a wire connecting region, a bendable region, and a bonding region, wherein a folding edge is formed between the wire connecting region and the bendable region, and the bonding region is provided with a plurality of bonding contacts arranged in a ring shape; and a driver IC, wherein a bonding surface of the driver IC is bonded to the bonding region.

In a preferred embodiment, the bonding surface of the driver IC is provided with a plurality of bonding pins arranged in a ring shape corresponding to the bonding contacts of the bonding region.

In another preferred embodiment, the display region of the flexible OLED unit module is circular.

In another preferred embodiment, an area of the wire connecting region is equal to an area of the bendable region.

In another preferred embodiment, the flexible OLED unit module supports a pointer display.

In another preferred embodiment, the bonding region is any of circular, square, hexagonal or another shape.

In another preferred embodiment, an area of the bonding region is smaller than an area of the display region.

In another preferred embodiment, the driver IC is circular.

The present invention also provides a method of preparing a wearable device, including: obtaining a flexible OLED unit module of the desired shape by a free shape cutting method; bonding the driver IC to the bonding region; and bending the bonding region on which the driver IC is bonded to the back of the display region along the folding edge.

In a preferred embodiment, the free shape cutting method includes at least one of laser cutting, cutter wheel cutting, and computer numerical control (CNC) cutting.

In another preferred embodiment, the laser cutting includes at least one of laser vaporization cutting, laser melting cutting, laser oxygen cutting, laser scribing, and controlled fracture.

The above method proposed by the present invention can effectively bend the bonding region of the OLED on which the driver IC is bonded to the back of the display panel, thereby saving the space of the entire display module. In addition, the use of the free shape cutting technique achieves a circular contour which can support a pointer display.

The invention further provides a wearable device, including:

a carrier having a carrying space; a wearing component connecting to the carrier; a flexible OLED unit module, the flexible OLED unit module being accommodated in the carrying space and including a display region, a wire connecting region, a bendable region, and a bonding region, wherein a folding edge is formed between the wire connecting region and the bendable region, and the bonding region is provided with a plurality of bonding contacts arranged in a ring shape; and a driver IC, wherein a bonding surface of the driver IC is bonded to the bonding region; wherein the bonding surface of the driver IC being provided with a plurality of bonding pins arranged in a ring shape corresponding to the bonding contacts of the bonding region, and the display region of the flexible OLED unit module is circular.

In a preferred embodiment, an area of the wire connecting region is equal to an area of the bendable region.

In another preferred embodiment, the flexible OLED unit module supports a pointer display.

In another preferred embodiment, the bonding region is any of circular, square, hexagonal or another shape.

In another preferred embodiment, an area of the bonding region is smaller than an area of the display region.

In another preferred embodiment, the driver IC is circular.

The driver IC of the display panel of the present invention described above adopts a plurality of bonding pins arranged in a ring shape. This design can reduce the bonding misalignment caused by the expansion or contraction of the substrate when the driver IC is bonded to the bonding region of the flexible OLED unit module, therefore, reducing the compensation demand caused by the expansion or contraction issue.

Beneficial Effect

The present invention utilizes a free shape cutting technique to implement a wearable device with a circular dial plate design that supports pointer display. In addition, in the preferred embodiment of the present invention, the driver IC of the circular display panel adopts a plurality of bonding pins arranged in a ring shape. This design can reduce the bonding misalignment caused by the expansion or contraction issue when the driver IC is bonded to the bonding region of the flexible organic light emitting diode (OLED) unit module, therefore, reducing the compensation demand caused by the expansion or contraction issue in the preparing process.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

The technical solutions in the embodiments of the present invention will be clearly and completely described as follows with reference to the drawings in the embodiments of the present invention. Obviously, the described embodiments are a part of the embodiments in the invention, not all of them. Based on the embodiments of the present invention, all other embodiments obtained by those skilled in the field without doing any creative activity are within the claimed scope of the present invention.

Using a focused high-power laser beam to irradiate a contour of the flexible organic light emitting diode (OLED) unit module to be cut, rapidly melting an irradiated material. At the same time, a molten organic substance is blown off by a high-speed airflow coaxial with a light beam, thereby cutting the flexible OLED unit module into a desired shape can be achieved.

Figure 1:
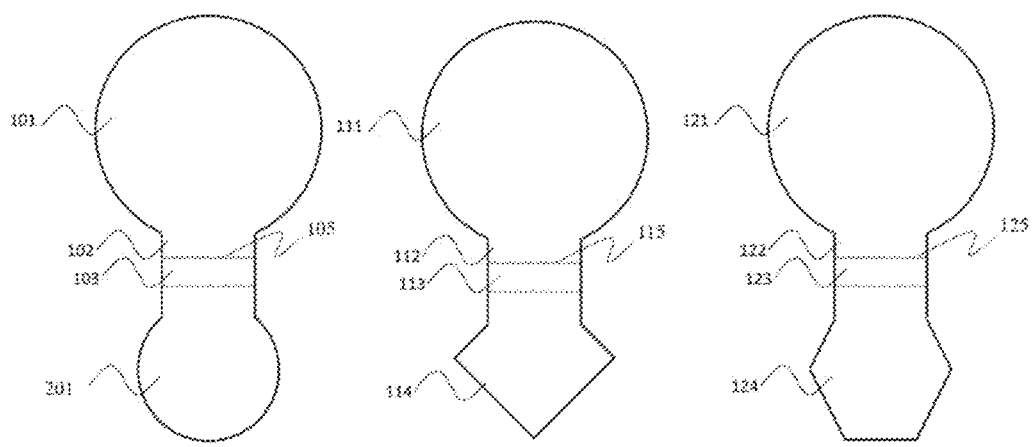
FIG. 1 is a schematic view of a flexible organic light emitting diode (OLED) unit module after being cut.

The OLED unit module is cut into a shape as shown in FIG. 1, wherein display regions (101, 111, 121) are circular, bonding regions (201, 114, 124) of the flexible OLED unit module may be in the shape of a circle, a square, or a hexagon, etc.

Figure 2:
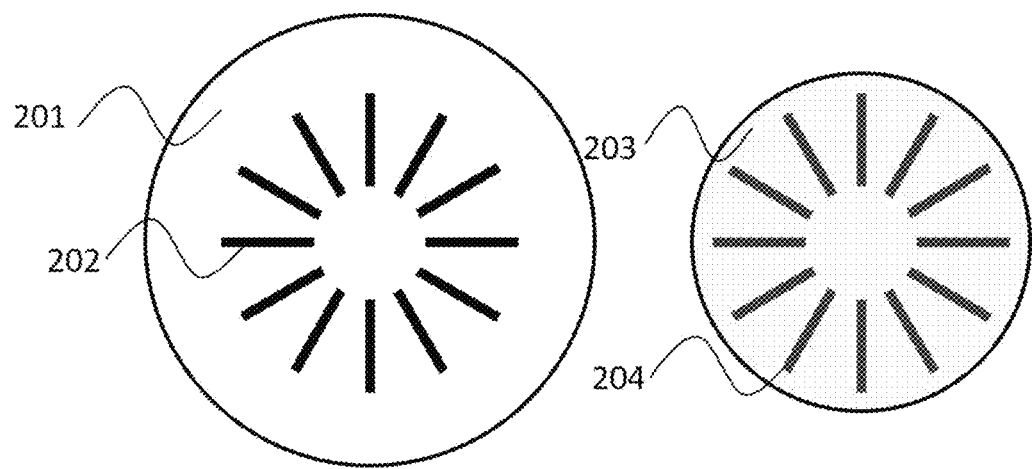
FIG. 2 is a schematic view of a bonding region of the flexible OLED unit module before being bonded to a driver integrated circuit (IC)

Using a die bonder to pick a driver integrated circuit (IC) having a plurality of strip-shaped, annular, and equidistantly arranged bonding pins (204, as shown in FIG. 2) and place it on a bonding region (201) (for example, a glass or a plastic substrate where an anisotropic conductive film is coated) of the flexible OLED unit module with an alignment manner, and then the driver IC (203) is bonded to the bonding region (201) of the flexible OLED unit module by hot pressing.

As shown in FIG. 2. In a preferred embodiment of the present invention, a bonding surface of the driver IC has 12 strip-shaped, annular, and equidistantly arranged bonding pins (204), the bonding pin can be a gold bump. And a bonding region (201) of the flexible OLED unit module also has 12 corresponding strip-shaped, annular, and equidistantly arranged bonding contacts (202), the bonding contact can be a copper pad.

In actual applications, the bonding region of the flexible OLED unit module and the driver IC bonding surface may be provided with hundreds or more bonding contacts and correspondingly bonding pins.

Figure 3:
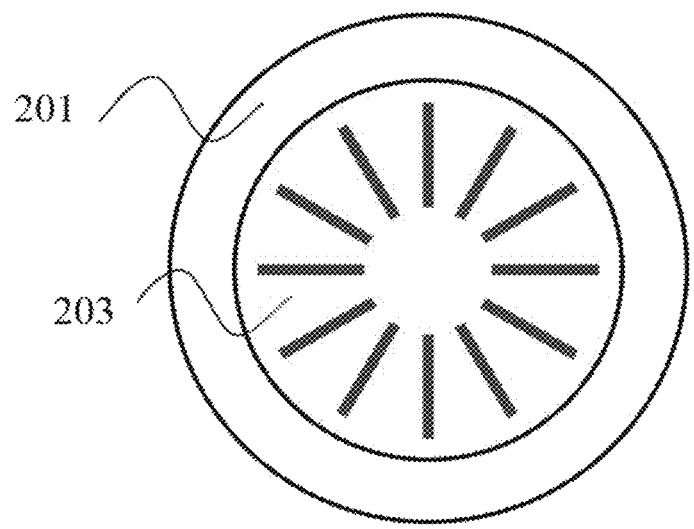
FIG. 3 is a schematic view of a bonding region of the flexible OLED unit module after being bonded to a driver IC.

The bonding region of the OLED unit module on which a driver IC (203) is bonded as shown in FIG. 3 is bent to the back of the display region along folding edges (105,115,125) between wire connecting regions (102,112,122) and bendable regions (103,113,123).

Figure 4:
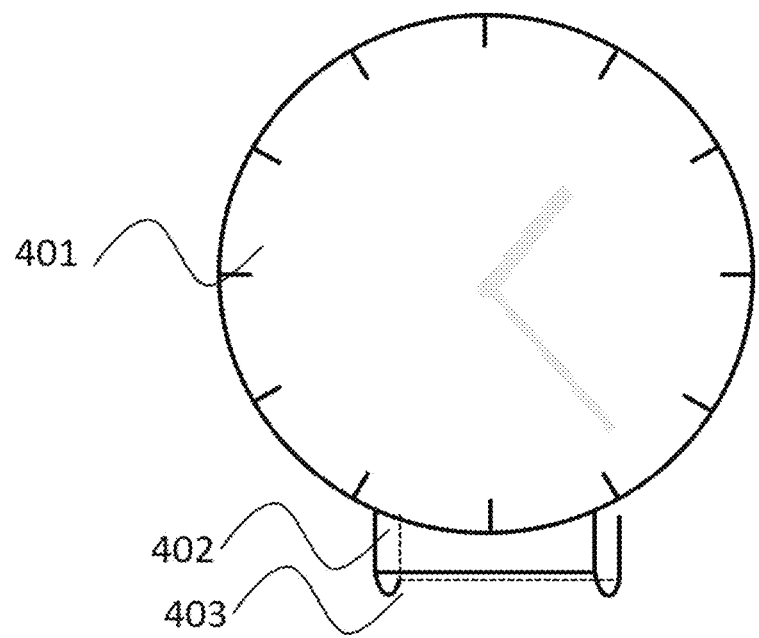
FIG. 4 is a schematic view of the flexible OLED unit module after being bent.

FIG. 4 is a schematic diagram of a flexible OLED unit module after being bent, wherein 401 is a display region of the OLED unit module; 402 is a wiring region of a bendable region of the OLED unit module; 403 is a bendable region of the OLED unit module. A design can effectively bend the bonding region of the OLED unit module to which the driver IC is bonded to the back of the display panel, thereby saving space of an entire display module.

Figure 5:
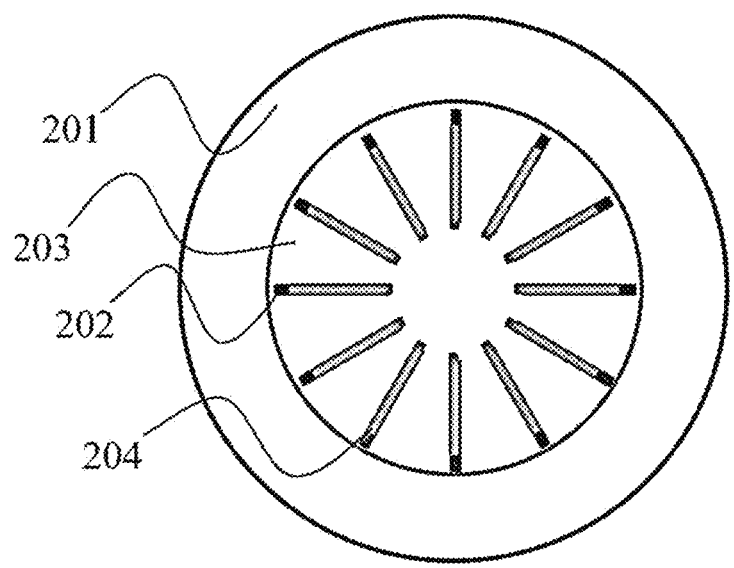
FIG. 5 is a schematic view of adopting a bonding pin designed by the present invention, showing an alignment of the bonding pins and bonding contacts when an area of the bonding contacts of the flexible OLED unit module expands 10%.

FIG. 5 is a schematic view adopting a bonding pin (202, 204) designed by a preferred embodiment of the present invention, showing the alignment of bonding pins and bonding contacts when an area of the bonding contacts of the flexible OLED unit module expands 10%. It can be observed, under this design, non-overlapping areas of the bonding pins (204) and the bonding contacts are less than 30% (overlapping areas are about 70% or more).

In the preferred embodiment of the present invention, the driver integrated circuit (IC) of a circular display panel adopts a plurality of bonding pins arranged in a ring shape. This design can reduce the bonding misalignment caused by expansion or contraction issues when the driver IC is bonded to the bonding region of the organic light emitting diode (OLED) unit module. Therefore, it reduces the compensation demand caused by the expansion or contraction issues.

Figure 6:
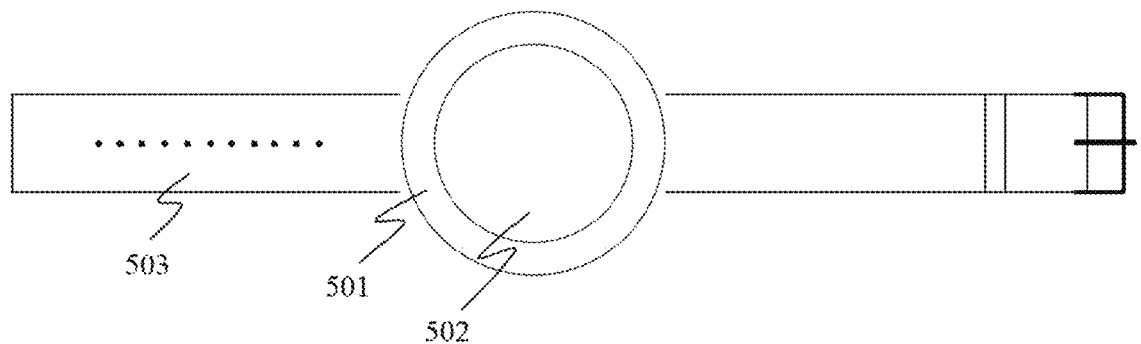
FIG. 6 is a schematic diagram of a flexible OLED wearable device.
Figure 7:
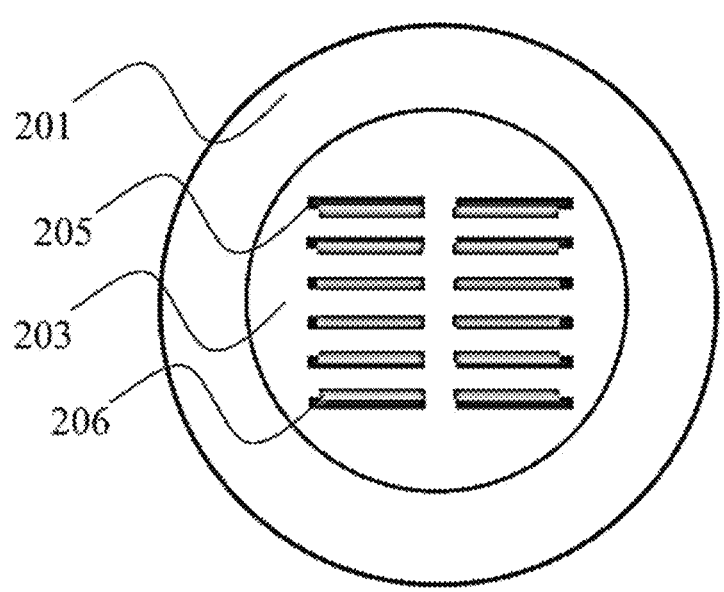
FIG. 7 is a schematic view of adopting a bonding pin of a conventional design, showing an alignment of the bonding pins and bonding contacts when an area of the bonding contacts of the flexible OLED unit module expands 10%.

Based on a preferred embodiment of the present application, a wearable device as shown in FIG. 6 can be implemented. The wearable device including a carrier (501) having a carrying space (502) where a flexible organic light emitting diode (OLED) unit module to which a driver integrated circuit (IC) is bonded being accommodated; and a wearing component (503) connected to the carrier.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A wearable device, comprising:
   a carrier having a carrying space;
   a wearing component connected to the carrier;
   a flexible organic light emitting diode (OLED) unit module, the flexible OLED unit module accommodated in the carrying space and including a display region, a wire connecting region, a bendable region, and a bonding region, wherein a folding edge is formed between the wire connecting region and the bendable region, and the bonding region is provided with a plurality of bonding contacts arranged in a ring shape; and a driver integrated circuit (IC), wherein a bonding surface of the driver IC is bonded to the bonding region.

2. The wearable device according to claim 1, wherein the bonding surface of the driver IC is provided with a plurality of bonding pins arranged in a ring shape corresponding to the bonding contacts of the bonding region.

3. The wearable device according to claim 1, wherein the display region of the flexible OLED unit module is circular.

4. The wearable device according to claim 1, wherein an area of the wire connecting region is equal to an area of the bendable region.

5. The wearable device according to claim 3, wherein the flexible OLED unit module supports a pointer display.

6. The wearable device according to claim 3, wherein the bonding region is any of circular, square, hexagonal or another shape.

7. The wearable device according to claim 3, wherein an area of the bonding region is smaller than an area of the display region.

8. The wearable device according to claim 3, wherein the driver IC is circular.

9. A method of preparing the wearable device according to claim 1, comprising:

obtaining a flexible organic light emitting diode (OLED) unit module of a desired shape by a free shape cutting method;

bonding a driver integrated circuit (IC) to a bonding region; and bending the bonding region on which the driver IC is bonded to the back of a display region along a folding edge.

10. The method of preparing the wearable device according to claim 9, wherein the free shape cutting method comprises at least one of laser cutting, cutter wheel cutting, and computer numerical control (CNC) cutting.

11. The method of preparing the wearable device according to claim 10, wherein the laser cutting comprises at least one of laser vaporization cutting, laser melting cutting, laser oxygen cutting, laser scribing, and a controlled fracture.

12. A wearable device, comprising:

a carrier having a carrying space;

a wearing component connecting to the carrier;

a flexible organic light emitting diode (OLED) unit module, the flexible OLED unit module being accommodated in the carrying space and including a display region, a wire connecting region, a bendable region, and a bonding region, wherein a folding edge is formed between the wire connecting region and the bendable region, and the bonding region is provided with a plurality of bonding contacts arranged in a ring shape; and a driver IC, wherein a bonding surface of the driver IC is bonded to the bonding region;

wherein the bonding surface of the driver IC being provided with a plurality of bonding pins arranged in a ring shape corresponding to the bonding contacts of the bonding region, and the display region of the flexible OLED unit module is circular.

13. The wearable device according to claim 12, wherein an area of the wire connecting region is equal to an area of the bendable region.

14. The wearable device according to claim 12, wherein the flexible OLED unit module supports a pointer display.

15. The wearable device according to claim 12, wherein the bonding region is any of circular, square, hexagonal or another shape.

16. The wearable device according to claim 12, wherein an area of the bonding region is smaller than an area of the display region.

17. The wearable device according to claim 12, wherein the driver IC is circular.

\* \* \* \* \*